United States Patent
Kim

[11] Patent Number: 5,923,052
[45] Date of Patent: Jul. 13, 1999

[54] LIGHT EMITTING DIODE

[75] Inventor: Cha Yeon Kim, Seoul, Rep. of Korea

[73] Assignee: LG Electronics Inc., Seoul, Rep. of Korea

[21] Appl. No.: 09/021,434

[22] Filed: Feb. 10, 1998

[30] Foreign Application Priority Data

Feb. 12, 1997 [KR] Rep. of Korea ............ 97-4162

[51] Int. Cl.$^6$ ............................................. H01L 33/00
[52] U.S. Cl. ............................ 257/91; 257/99; 257/103; 257/745; 257/751
[58] Field of Search ............................ 257/91, 99, 101, 257/103, 751, 763, 767, 743, 744, 745

[56] References Cited

U.S. PATENT DOCUMENTS 5,563,422  10/1996  Nakamura et al. .................... 257/103

*Primary Examiner*—Minh Loan Tran
*Attorney, Agent, or Firm*—John P. White; Cooper & Dunham LLP

[57] ABSTRACT

A light emitting diode (LED) and a method for fabricating the same are disclosed, the LED including the steps of successively forming a first epitaxial layer, an active layer, and a second epitaxial layer on a substrate; patterning the active layer and the second epitaxial layer to expose a predetermined area of the first epitaxial layer; increasing an amount of N on a predetermined area of the exposed first epitaxial layer to form a TiN layer and either an Au or Al layer on the TiN layer, so as to form a first electrtode of a bilayer structure; and forming a second electrode on a predetermined area of the second epitaxial layer.

3 Claims, 4 Drawing Sheets

LIGHT EMITTING DIODE

BACKGROUND OF THE INVENTION

1. Field of the Invention

The present invention relates to a display device and, more particularly, to a light emitting diode (LED) and a method for fabricating the same.

2. Discussion of the Related Art

In general, when injected electrons are recombined with pores in an LED, it emits overengergy in a form of light. For example, there are a red LED using GaAsP, a green LED using GaP, and a blue LED using an InGaN/AlGaN double hetero structure.

An LED, in which voltage is low and power consumption is low, is widely used in numeral and letter indicating device, signal light sensor, light source for optical coupler, etc.

There are four requirements to fabricate an LED. They are a satisfactory luminance, a sufficient life span, thermal stability, and performance in low voltage.

Since luminance is intimately associated with a material which an LED is made of, active research and development has been directed to good materials for LEDs. Diode's life span, thermal stability, and performance in low voltage affect contact resistance with a compound semiconductor and electrodes of LEDs. Thus, methods for fabricating an LED are currently suggested in which contact resistance is lowered so that current flows smoothly around contact areas of electrodes and the compound semiconductor. It however is not easy to reduce contact resistance.

FIGS. 1A–1C is a cross-sectional view showing a structure of a background LED made of a material of a GaN type which is good for blue LEDs.

As shown in FIGS. 1A–1C, a material for electrode is deposited on a GaN layer having a doping level of less than $10^{15}$, and then annealed so that carrier dopant is accumulated at the interface of the GaN layer and the material for electrode. Accordingly, potential barrier is decreased and resistance is thus lowered.

Because the GaN has a high resistance, a material for electrtode that contacts the GaN should be carefully selected to lower contact resistance. Titanium is mainly used as a material for electrode because TiN is formed at the interface of the titanium and a GaN layer.

That is, when N in the GaN is coupled with Ti, the GaN for lack of N has to secure sufficient carriers having high density. Accordingly, current flows well by the decrease of resistance.

Therefore, while an n type electrode is made of Au/Ti, Al/Ti, or Au/Ti/Al/Ti, a p type electrode is made of Au/Ni/Cr. The reason that a stack of metal layers is used as an electrode is because of morphology. When a material for electrode is selected, its reaction with GaN as well as morphology of the electrode should be taken into account.

Unless the surface of an electrode is clean, wires in connection with the electrode may be disconnected, thereby deteriorating device performance.

Therefore, a plurality of metal layers, stacked to form an electrode, should have good reaction with one another, thereby reducing the morphology of the electrode. However, morphology is still a problem.

A background LED has the following problems. Since many metal layers are stacked to form an electrode and then annealed at a high temperature of higher than 700° C., the whole fabricating process is complex and inefficient.

Further, when the annealing process is performed, Ti in the electrode is diffused and finally coupled with Al or Au. As a result, the surface of the electrtode is fluctuated and its reaction with GaN becomes poor so that it becomes impossible to obtain a desired resistance. Furthermore, it is difficult to perform following process steps such as wire bonding due to morphology.

SUMMARY OF THE INVENTION

Therefore, the present invention is directed to an LED and a method for fabricating the same that substantially obviates one or more of problems due to limitations and disadvantages of the related art.

An object of the invention is to provide an LED and a method for fabricating the same in which a new material for electrode is used, thus simplifying the process.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the LED is characterized in that an n type electrode includes a first layer made of TiN/Ti or a TiN layer in which the concentration of N becomes higher upward the top surface of the TiN layer.

In another aspect, an LED includes a first epitaxial layer formed on a semiconductor substrate; an active layer formed on a predetermined area of the first epitaxial layer; a second epitaxial layer formed on the active layer; a first electrode formed on a predetermined area of the first epitaxial layer to have a TiN layer having an N-increasing gradient and either an Au or Al layer formed on the TiN layer; and a second electrode formed on a predetermined area of the second epitaxial layer.

In still another aspect, an LED includes a first epitaxial layer on a substrate; an active layer formed on a predetermined area of the first epitaxial layer; a second epitaxial layer formed on the active layer; a first electrode including first and second and third layers, wherein the first layer is formed of Ti on a predetermined area of the first epitaxial layer, the second layer is formed of TiN, and the third layer is formed of either Au or Al; and a second electrode formed on a predetermined area of the second epitaxial layer.

In still other aspect, a method for fabricating an LED includes the steps of successively forming a first epitaxial layer, an active layer, and a second epitaxial layer on a substrate; patterning the active layer and the second epitaxial layer to expose a predetermined area of the first epitaxial layer; increasing an amount of N on a predetermined area of the exposed first epitaxial layer to form a TiN layer and either an Au or Al layer on the TiN layer, so as to form a first electrtode of a bilayer structure; and forming a second electrode on a predetermined area of the second epitaxial layer.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

FIGS. 2A to 2D are cross-sectional views showing process steps of a method for fabricating an LED according to the first embodiment of the present invention.

Figures 1A, 1B, 1C:
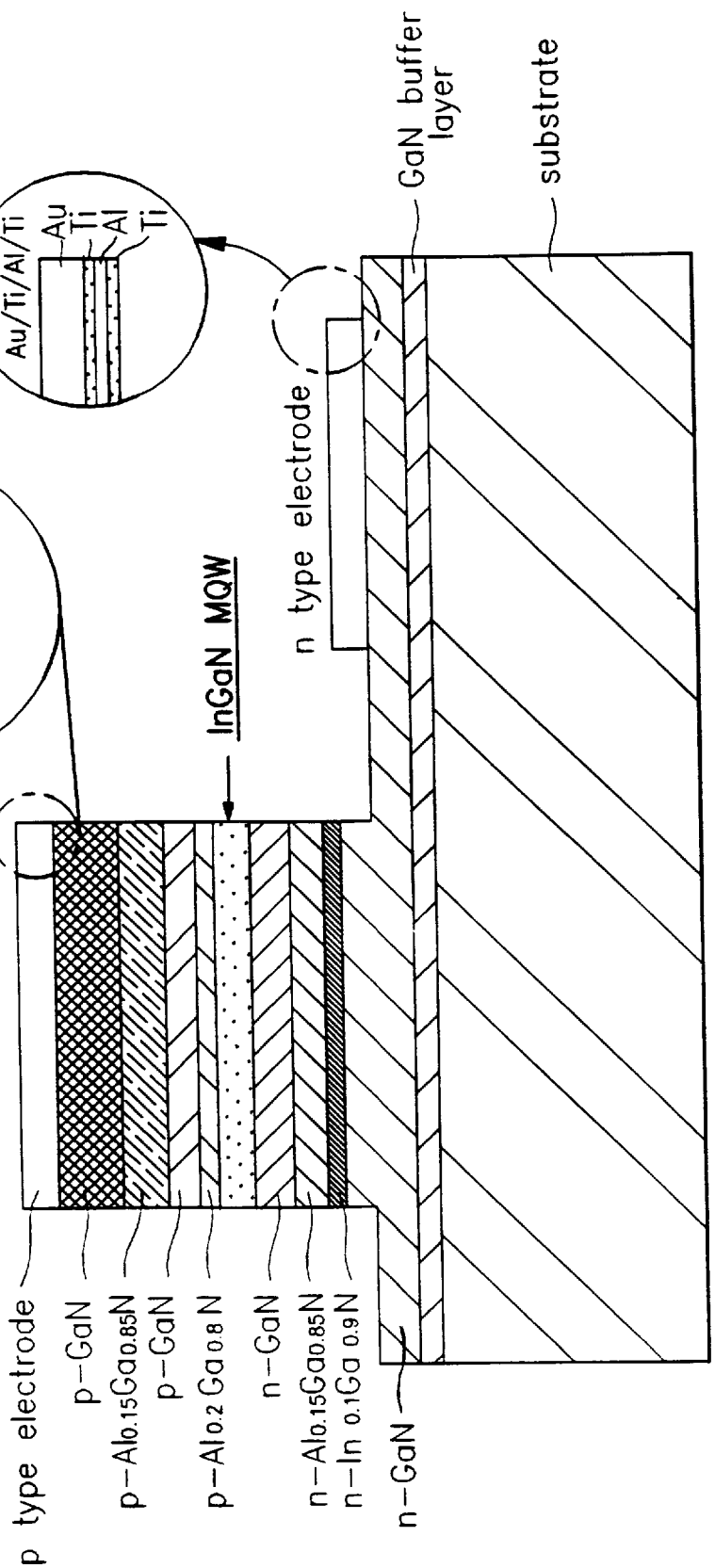
FIGS. 1A–1C is a cross-sectional view showing a structure of a background LED.
Figure 2A:
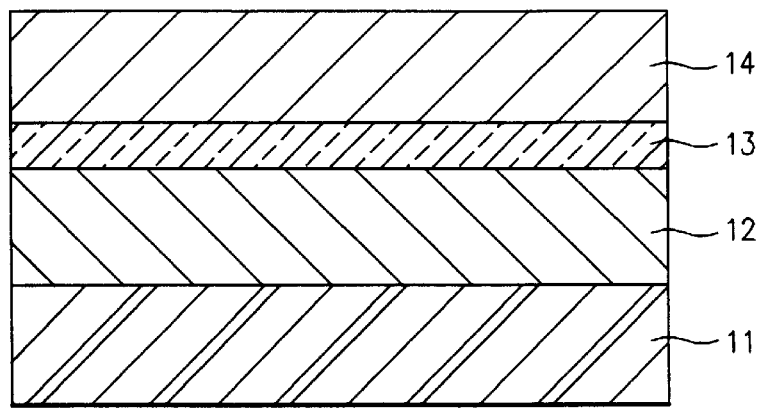
FIGS. 2A to 2D are cross-sectional views showing process steps of a method for fabricating an LED according to the embodiment of the present invention.

Referring initially to FIG. 2A, an n type epitaxial layer 12 doped with n type impurity ions is grown on a cleansed sapphire substrate 11. An active layer 13 and a p type epitaxial layer 14 doped with p type impurity ions are grown on the n type epitaxial layer 12. The n and p type epitaxial layers 12 and 14 are made of GaN.

Figure 2B:
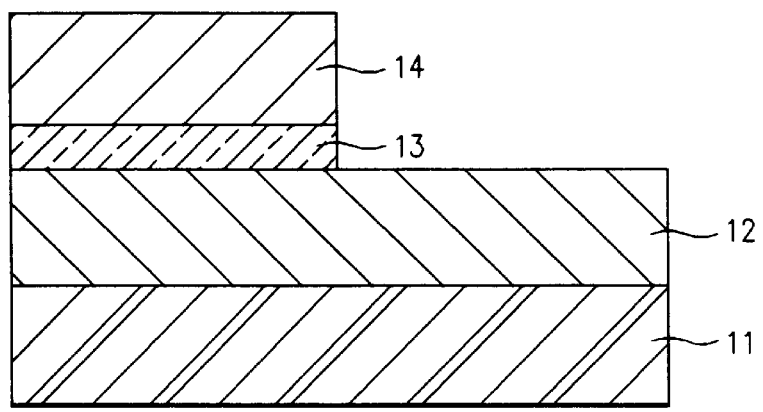

Referring to FIG. 2B, the active layer 13 and the p type epitaxial layer 14 are selectively removed with a photolithography process and an etching process, so as to expose a predetermined area of the n type epitaxial layer 12.

Figure 2C:
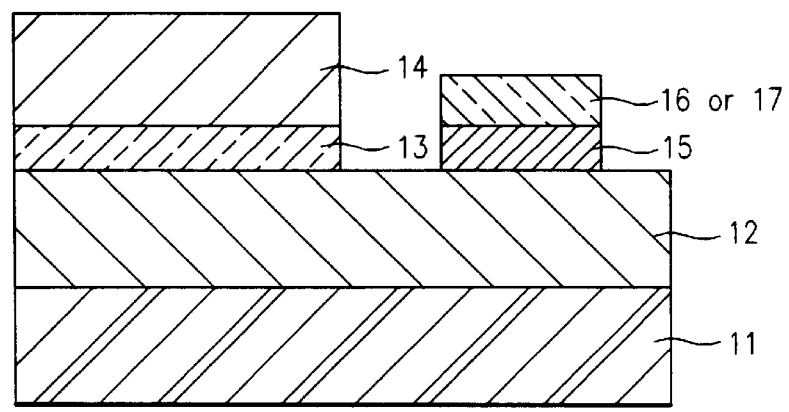

Referring to FIG. 2C, a TiN layer 15 is formed on the n type epitaxial layer 12 by using an mixture gas such as $N_2+Ar$ or $NH_3+Ar$ to have a gradient that the more an amount of N is, the more upward the TiN layer 15 is. Next, an Al layer 16 or an Au layer 17 is formed on the TiN layer 15 and patterned to form an n type electrode on a predetermined area of the n type epitaxial layer 12. The n type electrode is annealed at a temperature of higher than 700° C. At the top surface of the TiN layer 15, the ratio of Ti and N is 1:1.

The reason that the amount of N in the TiN layer 15 increases upward the TiN layer 15 is as follows: the diffusion of the depth direction of Au or Al on the TiN layer 15 is prevented, the diffusion toward the Ti is prevented, and N is easily provided from GaN of the n type epitaxial layer 12 at the lower portion of the TiN layer 15 in order that the n type electrode is easily formed.

Since the amount of N in the TiN layer 15 is almost equal to that of Ti at the top surface of the TiN layer 15, the diffusion of Ti into Al or Au is effectively prevented in an annealing process. Besides the diffusion of Al or Au inward is also prevented. Therefore, the morphology at the surface of the electrode is very good.

On the contrary, N lacks and Ti abounds at the bottom of the TiN layer 15. At the annealing process, N in the GaN is easily provided for the bottom of the TiN layer 15 so that the ratio of Ti and N at the bottom of the TiN layer 15 becomes almost the same as that at the top of the TiN layer 15. On the other hand, the GaN lacks N because N in the GaN is given to the TiN layer 15. Thus much of electron carrier is formed at the n type epitaxial layer 12, thereby easily forming an n type electrode.

Figure 2D:
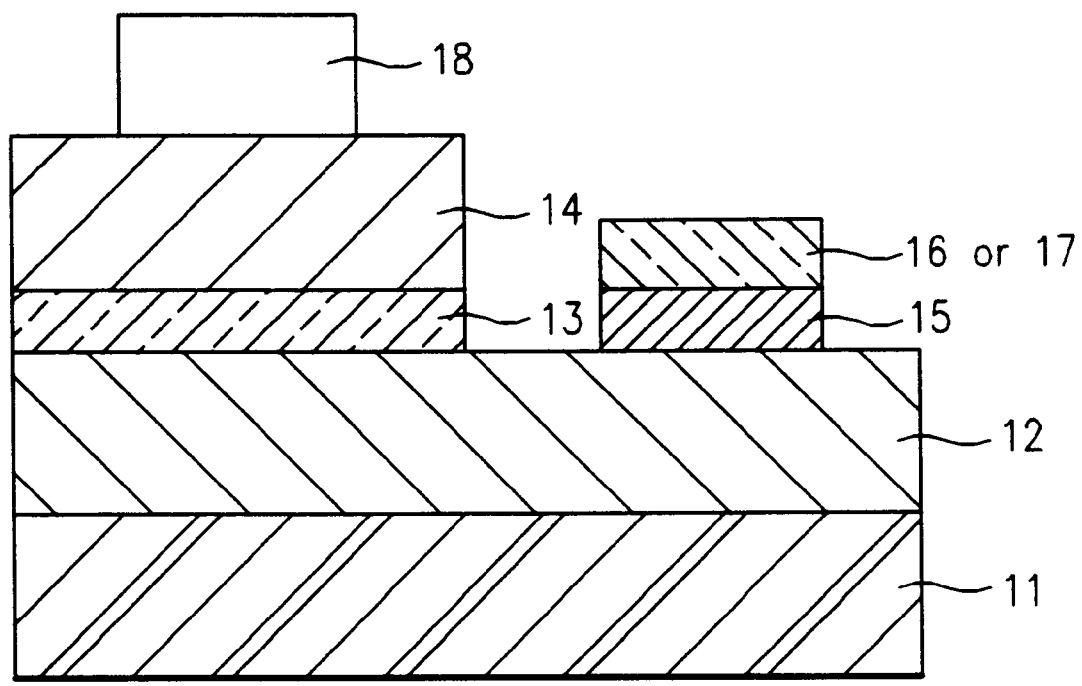

Referring to FIG. 2D, one of Ni, Cr, Au is formed on the p type epitaxial layer 14 and then Pt or Pd as a wetting agent is formed and patterned to form a p type electrode 18, thereby completing an LED.

According to the first embodiment, the n type electrode is formed of bilayer including the TiN layer 15 having a gradient that an amount of N is increasing upward the top of the TiN layer 15 and an Al layer 16 or an Au layer 17. Accordingly, the process is simplified and the characteristic of morphology of electrodes is improved.

Figure 3:
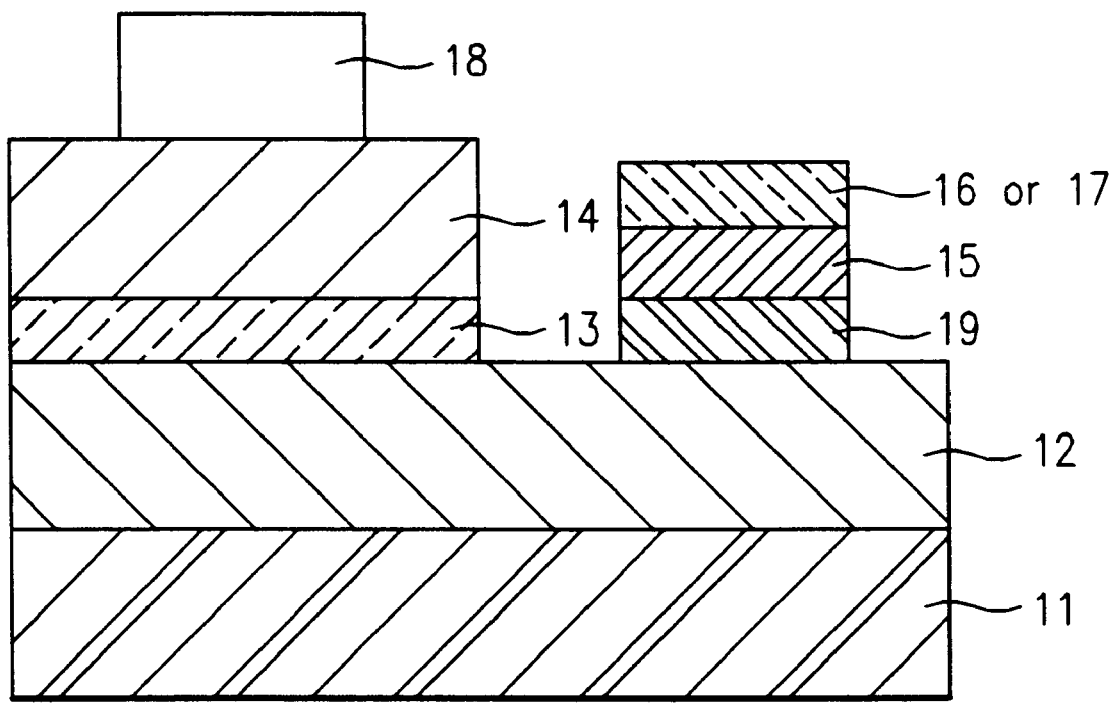
FIG. 3 is a cross-sectional view showing a structure of an LED according to a second embodiment of the present invention.

FIG. 3 is a cross-sectional view showing a structure of an LED according to the second embodiment of the present invention. An n type electrode is formed of triple layers including a Ti layer 19, a TiN layer 15, and either an Al layer 16 or an Au layer 17. In spite of the different structure from that of the first embodiment, the same effects as those of the first embodiment are obtained.

An LED and a method for fabricating the same of the present invention have the following advantages. Since an n type electrode is formed of bilayer, the whole process is simplified and the production cost is reduced. Further, the loss of Ti through a contact metal at an annealing process is prevented so that the morphology of the surface of the contact metal is maintained clean. As a result, a following process step such as wire bonding is easily performed. Furthermore, the bottom portion of the TiN layer is provided with N from GaN of an n type epitaxial layer at an annealing process, so that it is easier to form an n type electrode, thereby enhancing the device performance.

It will be apparent to those skilled in the art that various modification and variations can be made in the LED and the method for fabricating the same of the present invention without departing from the spirit or scope of the inventions. Thus, it is intended that the present invention cover the modifications and variations of this invention provided they come within the scope of the appended claims and their equivalents.

What is claimed is:

1. an LED comprising:

a first epitaxial layer formed on a semiconductor substrate;

an active layer formed on a predetermined area of the first epitaxial layer;

a second epitaxial layer formed on the active layer;

a first electrode formed on a predetermined area of the first epitaxial layer to have a TiN layer having an N-increasing gradient and either an Au or Al layer formed on the TiN layer; and a second electrode formed on a predetermined area of the second epitaxial layer.

2. The method as claimed in claim 1, wherein a ratio of Ti and N at top surface of the TiN layer is 1:1.

3. An LED comprising:

a first epitaxial layer formed on a substrate;

an active layer formed on a predetermined area of the first epitaxial layer;

a second epitaxial layer formed on the active layer;

a first electrode including first, second, and third layers, wherein the first layer is formed of Ti on a predetermined area of the first epitaxial layer, the second layer is formed of TiN, and the third layer is formed of either Au or Al; and a second electrode formed on a predetermined area of the second epitaxial layer.

* * * * *